United States Patent
Shih et al.

(10) Patent No.: US 12,198,991 B2
(45) Date of Patent: Jan. 14, 2025

(54) TEST STRUCTURE FOR USE IN DYNAMIC RANDOM ACCESS MEMORY AND MANUFACTURING METHOD THEREOF

(71) Applicant: NANYA TECHNOLOGY CORPORATION, New Taipei (TW)

(72) Inventors: Chiang-Lin Shih, New Taipei (TW); Hsueh-Han Lu, New Taipei (TW); Yu-Ting Lin, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 395 days.

(21) Appl. No.: 17/661,751

(22) Filed: May 3, 2022

(65) Prior Publication Data

US 2023/0360979 A1    Nov. 9, 2023

(51) Int. Cl.
*H10B 12/00* (2023.01)
*H01L 21/66* (2006.01)

(52) U.S. Cl.
CPC .............. *H01L 22/32* (2013.01); *H01L 22/34* (2013.01); *H10B 12/0335* (2023.02); *H10B 12/315* (2023.02); *H10B 12/34* (2023.02); *H10B 12/482* (2023.02)

(58) Field of Classification Search
CPC ....... H01L 22/32; H01L 22/34; H10B 12/315; H10B 12/34; H10B 12/482; H10B 12/0335
See application file for complete search history.

(56) References Cited

U.S. PATENT DOCUMENTS

| | | | |
|---|---|---|---|
| 10,535,660 B1 | 1/2020 | Chuang et al. | |
| 11,765,885 B2 * | 9/2023 | Kim | H10B 12/488 257/296 |
| 2013/0214338 A1 * | 8/2013 | Mikasa | H01L 27/0629 257/296 |
| 2016/0064277 A1 * | 3/2016 | Park | H01L 21/02603 438/386 |
| 2023/0171970 A1 * | 6/2023 | Wang | H10B 12/09 438/3 |
| 2024/0213303 A1 * | 6/2024 | Park | H01G 4/085 |

* cited by examiner

*Primary Examiner* — David Vu
*Assistant Examiner* — Brandon C Fox
(74) *Attorney, Agent, or Firm* — CKC & Partners Co., LLC

(57) ABSTRACT

A test structure for use in a dynamic random access memory is provided. A first gate structure is disposed in a semiconductor substrate. First and second source/drain regions are disposed in the semiconductor substrate and at two sides of the first gate structure. A bit line structure is disposed on the first source/drain region. A dielectric layer is disposed on the semiconductor substrate and the bit line structure. A first landing pad is disposed on the dielectric layer. A first contact plug is disposed in the dielectric layer and electrically connects the second source/drain region and the first landing pad. A conductive layer is disposed on and electrically connected to the first landing pad, in which a first upper surface of the first landing pad is entirely covered by the conductive layer, and the conductive layer has a substantially planar upper surface.

20 Claims, 8 Drawing Sheets

TEST STRUCTURE FOR USE IN DYNAMIC RANDOM ACCESS MEMORY AND MANUFACTURING METHOD THEREOF

BACKGROUND

Field of Invention

The present disclosure relates to a test structure for use in a dynamic random access memory (DRAM) and a manufacturing method thereof.

Description of Related Art

A dynamic random access memory (DRAM) cell structure typically includes metal oxide semiconductor (MOS) transistors and cell capacitors that are built in or on a semiconductor substrate. The MOSFETs and the capacitors form a series connection with each other. A DRAM cell structure can be read and programmed by using word lines and bit lines.

In a producing process of the DRAM, it takes many steps to form the cell capacitors and the transistors to build up memory cells. To ensure these structures are correctly formed by those steps in or on the semiconductor substrate, test structures are usually formed concurrently. During the steps, the correctness of the structures can be ensured by detecting the electrical properties or other features of the test structures.

In view of the descriptions above, there is a need to develop a test structure for DRAM.

SUMMARY

The present disclosure provides a test structure for use in a dynamic random access memory. The test structure includes a semiconductor substrate, a first gate structure, a first source/drain region, a second source/drain region, a bit line structure, a dielectric layer, a first landing pad, a first contact plug, and a conductive layer. The first gate structure is disposed in the semiconductor substrate. The first source/drain region and the second source/drain region are disposed in the semiconductor substrate and at two sides of the first gate structure. The bit line structure is disposed on the first source/drain region. The dielectric layer is disposed on the semiconductor substrate and the bit line structure. The first landing pad is disposed on the dielectric layer. The first contact plug is disposed in the dielectric layer and electrically connects the second source/drain region and the first landing pad. The conductive layer is disposed on and electrically connected to the first landing pad, in which a first upper surface of the first landing pad is entirely covered by the conductive layer, and the conductive layer has a substantially planar upper surface.

In some embodiments, the substantially planar upper surface of the conductive layer is not in contact with a dielectric material.

In some embodiments, the conductive layer is in contact with the first upper surface of the first landing pad.

In some embodiments, the conductive layer is in contact with a first sidewall of the first landing pad.

In some embodiments, the test structure further includes a barrier layer between the conductive layer and the first landing pad.

In some embodiments, the barrier layer conformally covers the dielectric layer and the first landing pad.

In some embodiments, the barrier layer is in contact with the conductive layer and the first landing pad.

In some embodiments, the test structure further includes a second gate structure, a third source/drain region, a second landing pad, and a second contact plug. The second gate structure is disposed in the semiconductor substrate. The third source/drain region is disposed in the semiconductor substrate, in which the first source/drain region and the third source/drain region are at two sides of the second gate structure. The second landing pad is disposed between the dielectric layer and the conductive layer. The second contact plug is disposed in the dielectric layer and electrically connects the third source/drain region and the second landing pad, in which the conductive layer is electrically connected to the second landing pad, and a second upper surface of the second landing pad is entirely covered by the conductive layer.

In some embodiments, the conductive layer is a continuous layer.

In some embodiments, the conductive layer is in contact with the first upper surface of the first landing pad and the second upper surface of the second landing pad.

In some embodiments, the conductive layer is in contact with a first sidewall of the first landing pad and a second sidewall of the second landing pad.

In some embodiments, the test structure further includes a barrier layer on the first landing pad and the second landing pad and under the conductive layer.

In some embodiments, the barrier layer conformally covers the dielectric layer, the first landing pad, and the second landing pad.

In some embodiments, the barrier layer is in contact with the first landing pad, the second landing pad, and the conductive layer.

The present disclosure provides a method of manufacturing a test structure for use in a dynamic random access memory. The method includes the following operations. A semiconductor substrate, a first gate structure, a first source/drain region, and a second source/drain region are received, in which the first gate structure, the first source/drain region, and the second source/drain region are disposed in the semiconductor substrate, and the first source/drain region and the second source/drain region are at two sides of the first gate structure. A bit line structure is formed on the first source/drain region. A dielectric layer is formed on the bit line structure and the semiconductor substrate. A first contact plug is formed and penetrates through the dielectric layer. The first contact plug is in contact with the second source/drain region. A first landing pad is formed on the first contact plug. A conductive layer is formed on the first landing pad, in which the conductive layer is electrically connected to the first landing pad, a first upper surface of the first landing pad is entirely covered by the conductive layer, and the conductive layer has a substantially planar upper surface.

In some embodiments, the method further includes planarizing an upper surface of the conductive layer.

In some embodiments, the method further includes forming a barrier layer on and in contact with the first landing pad before forming the conductive layer on the first landing pad.

In some embodiments, forming the conductive layer on the first landing pad includes: forming the conductive layer in contact with the first landing pad.

In some embodiments, the method further includes the following operations. A second gate structure and a third source/drain region are received, in which the second gate structure and the third source/drain region are disposed in the semiconductor substrate, and the first source/drain region and the third source/drain region are at two sides of the first gate structure. A second contact plug is formed and penetrates through the dielectric layer. The second contact plug is in contact with the third source/drain region. A second landing pad is formed on the second contact plug. The conductive layer is formed on the second landing pad, in which the conductive layer is electrically connected to the second landing pad, and a second upper surface of the second landing pad is entirely covered by the conductive layer.

In some embodiments, after forming the conductive layer on the first landing pad, the conductive layer is in contact with the first landing pad and the second landing pad.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
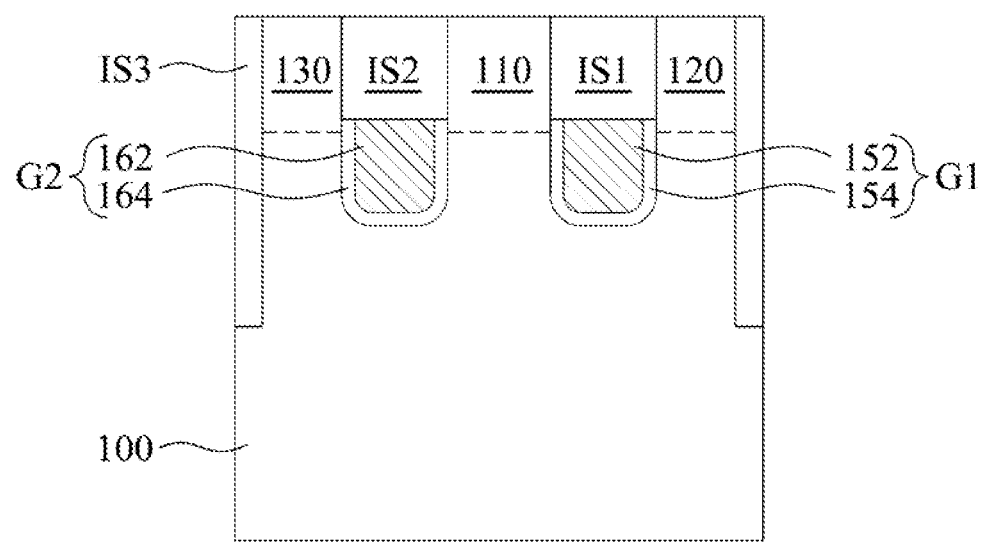
FIGS. 1-6 are cross-sectional views schematically illustrating intermediate stages in the manufacturing of a test structure for use in a dynamic random access memory, in accordance with some embodiments of the present disclosure.

Reference will now be made in detail to the present embodiments of the, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

A dynamic random access memory (DRAM) includes a large number of memory cells, and each memory cell is composed of a metal oxide semiconductor (MOS) transistor and a cell capacitor stacked in series. The MOS transistors and the cell capacitors are electrically connected by using word lines and bit lines to determine the position of each memory cell.

The cell capacitor of the memory cell includes two electrode layers and a cell dielectric layer to separate the electrode layers, in which the lower electrode is a storage electrode, and the upper electrode is a field plate. The storage electrode is usually connected to the MOS transistor by a cell contact (i.e., contact plug) to access the data in the memory cell. In order to improve the integration of DRAM and simplify the manufacturing process, most of the DRAM cell capacitors use landing pads as a bridge to make the cell contact to connect the MOS transistors to the cell capacitors or bit lines. Therefore, there is a need to develop a test structure for detecting the quality of the landing pads at the front end of the manufacturing process. The test structure can early detect the electrical performance of landing pads from wafer acceptance test (WAT) data, for example, at M1 stage. The landing pads having good quality can make reliable electrical connection between the MOS transistors and the cell capacitors.

FIGS. 1-6 are cross-sectional views schematically illustrating intermediate stages in the manufacturing of a test structure for use in a dynamic random access memory, in accordance with some embodiments of the present disclosure.

Please refer to FIG. 1. A semiconductor substrate 100, a first gate structure G1, a second gate structure G2, a first isolation structure IS1, a second isolation structure IS2, a first source/drain region 110, a second source/drain region 120, a third source/drain region 130, and a third isolation structure IS3 are received. The first gate structure G1, the second gate structure G2, the first isolation structure IS1, the second isolation structure IS2, the first source/drain region 110, the second source/drain region 120, the third source/drain region 130, and the third isolation structure IS3 are disposed in the semiconductor substrate 100. The third isolation structure IS3, such as a shallow trench isolation (STI) structure, is for defining at least an active region. The first source/drain region 110 and the second source/drain region 120 are at two sides of the first gate structure G1. The first source/drain region 110 and the third source/drain region 130 are at two sides of the second gate structure G2. The first gate structure G1 includes a gate layer 152 and a gate insulating layer 154. The first isolation structure IS1 is disposed on the first gate structure G1. The second gate structure G2 includes a gate layer 162 and a gate insulating layer 164. The second isolation structure IS2 is disposed on the second gate structure G2.

In some embodiments, the semiconductor substrate 100 includes silicon (Si), gallium (Ga), gallium arsenide (GaAs), gallium nitride (GaN), strained silicon, silicon-germanium (SiGe), silicon carbide (SiC), diamond, epitaxy layer or combinations thereof, but the disclosure is not limited thereto.

In some embodiments, the first gate structure G1 and the second gate structure G2 are buried gate structures, but the disclosure is not limited thereto. In some embodiments, the first gate structure G1 and the second gate structure G2 are formed by the following operations. Trenches (not shown) are formed in the semiconductor substrate 100 by proper etchants. Next, the gate insulating layers 154, 164 are conformally formed in the trenches to cover the sidewalls and bottoms of the trenches. In some embodiments, the gate insulating layers 154, 164 can include dielectric material having high dielectric constant (high-k). For example, the gate insulating layers 154, 164 can include SiO, $SiO_2$, silicon nitride (SiN), silicon oxynitride (SiON), metal oxide such as hafnium oxide (HfO, $HfO_2$), or other suitable material chosen for compatibility, but the disclosure is not limited thereto. The gate layers 152, 162 are formed on the gate insulating layers 154, 164 and recessed such that the top surfaces of the gate layers 152, 162 are lower than the openings of the trenches. In some embodiments, the gate layers 152, 162 can include polysilicon or other suitable material such as metal materials with proper work function, but the disclosure is not limited thereto. Next, the first isolation structure IS1 and the second isolation structure IS2 are formed to fill the trenches, and a planarization process may be performed. Consequently, the first gate structure G1 and the second gate structure G2, which serve as buried word lines for a DRAM device, are obtained.

Next, the first source/drain region 110, the second source/drain region 120, and the third source/drain region 130 are formed in the semiconductor substrate 100. These source/drain regions include an n-type or a p-type doped region, depending on the conductivity type of the transistor structure to be formed.

Figure 2:
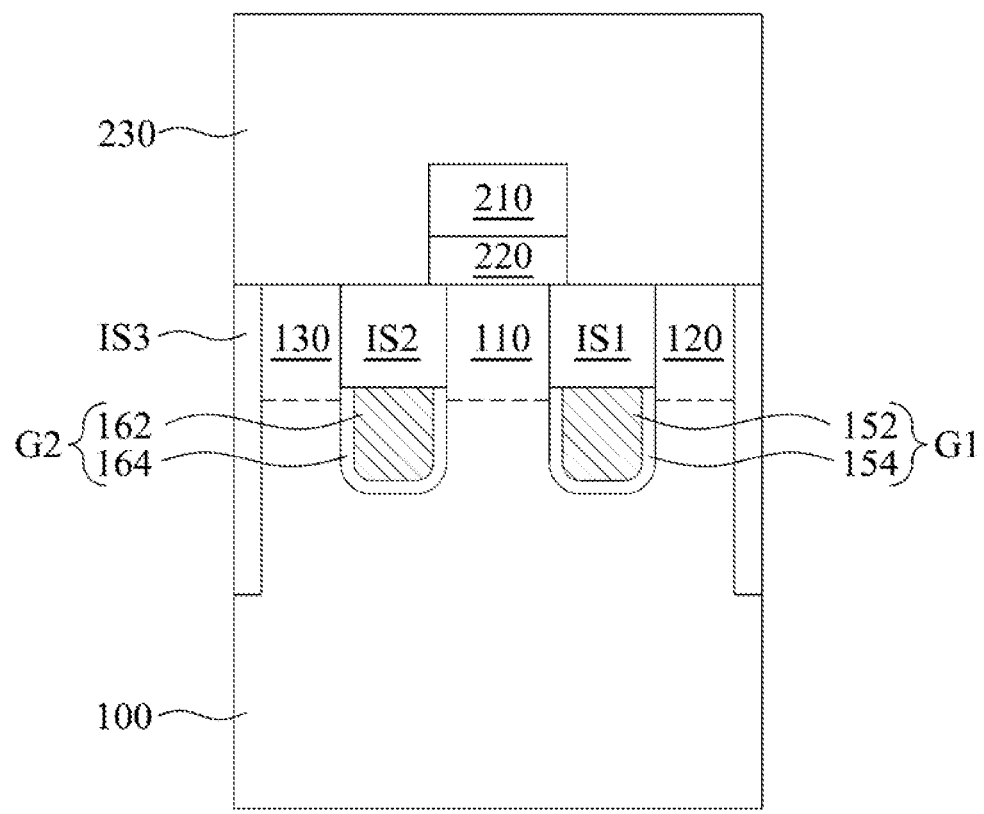

Reference is made to FIG. 2. A bit line structure 210 and a first barrier layer 220 are formed on the first source/drain region 110, and a dielectric layer 230 is formed on the bit line structure 210 and the semiconductor substrate 100. The first barrier layer 220 can enhance the adhesion between the bit line structure 210 and the first source/drain region 110. In some embodiments, the barrier layer is omitted, and therefore the bit line structure 210 is in contact with the first source/drain region 110. In some embodiments, the first barrier layer 220 includes titanium (Ti), titanium nitride (TiN), tantalum mononitride (TaN), or combinations thereof, but the disclosure is not limited thereto.

Figure 3:
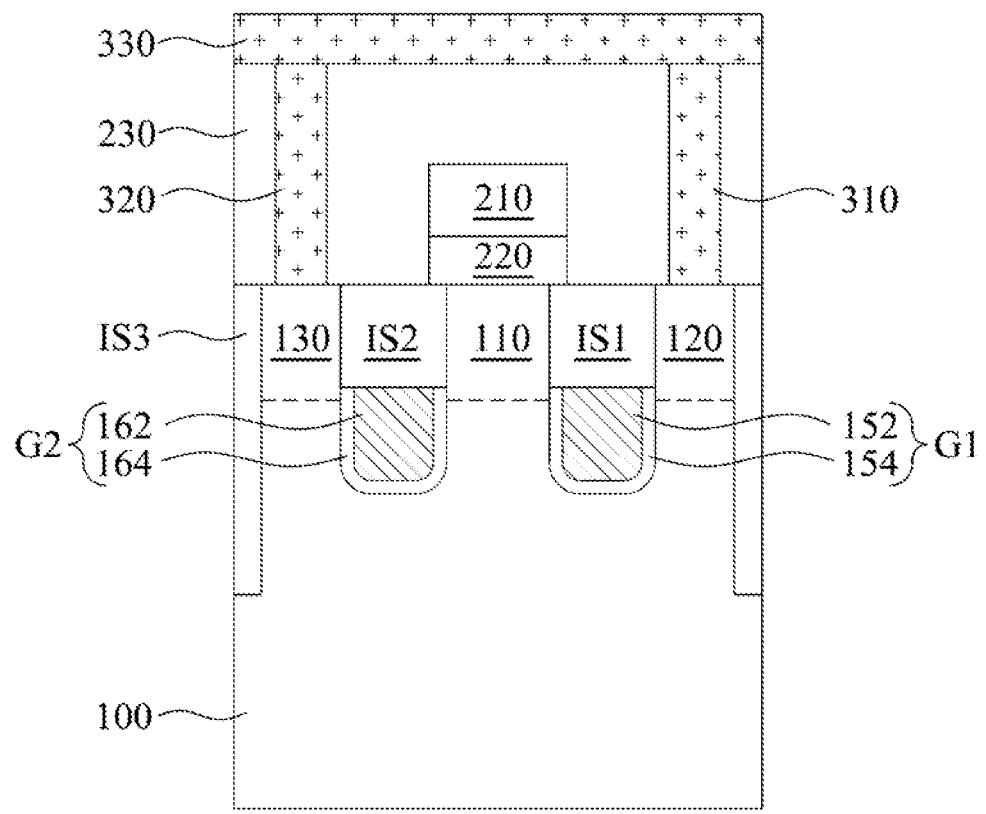

As shown in FIG. 3, a first contact plug 310 and a second contact plug 320 are formed in the dielectric layer 230, and the both penetrate through the dielectric layer 230. The first contact plug 310 is in contact with the second source/drain region 120, and the second contact plug 320 is in contact with the third source/drain region 130. Moreover, a conductive layer 330 is formed on and in contact with the first contact plug 310, the second contact plug 320, and the dielectric layer 230. In some embodiments, the conductive layer 330 includes tungsten (W), tungsten silicide (WSi$_2$), aluminum (Al), copper (Cu), titanium (Ti), titanium nitride (TiN), cobalt (Co), polysilicon, or combinations thereof, but the disclosure is not limited thereto.

Figure 4:
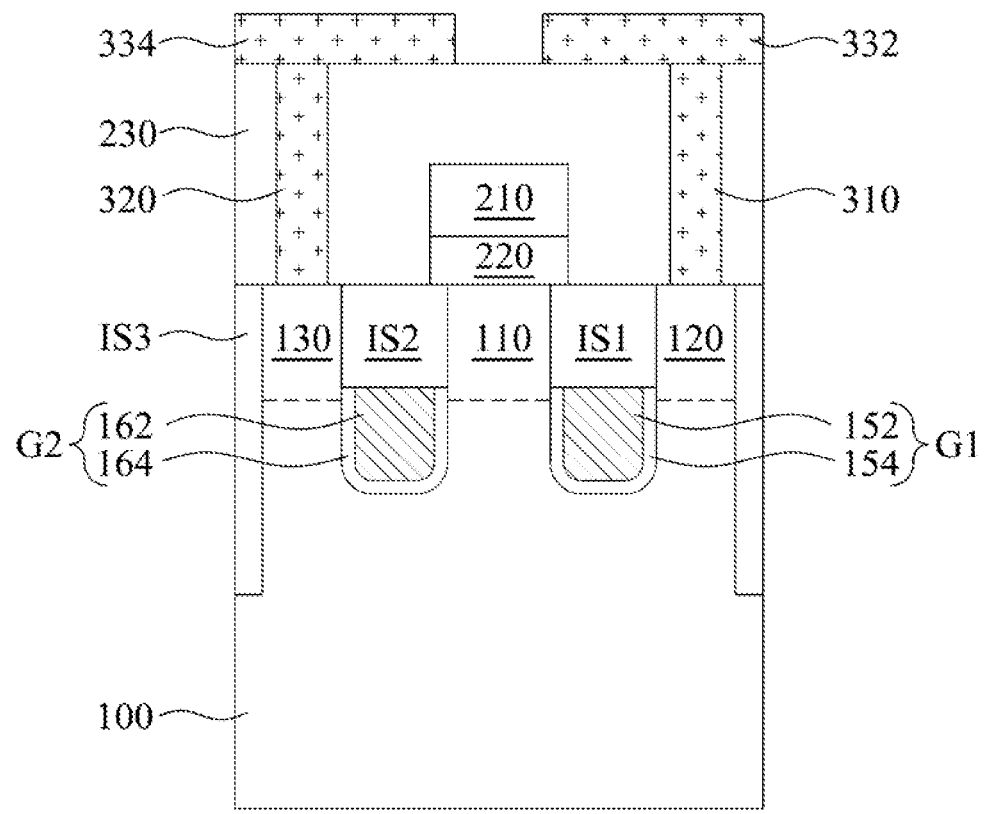

Please refer to FIG. 4. The conductive layer 330 is patterned to form a first landing pad 332 on the first contact plug 310 and to form a second landing pad 334 on the second contact plug 320. In other words, portions of the conductive layer 330 are removed to form the first landing pad 332 the second landing pad 334.

Figure 5:
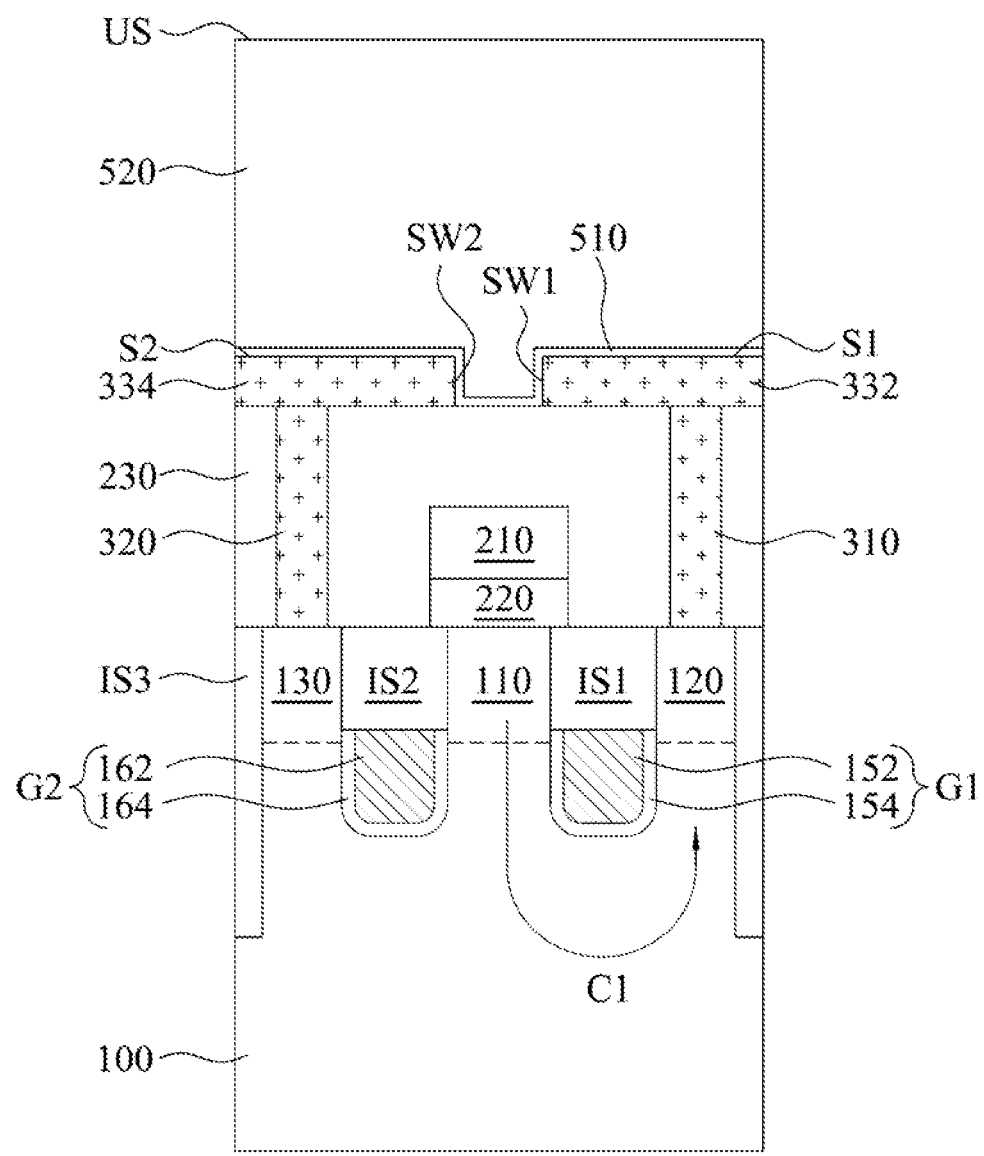

Reference is made to FIG. 5. A second barrier layer 510 is formed on the first landing pad 332, the second landing pad 334, and the dielectric layer 230, and a conductive layer 520 is formed on the second barrier layer 510 to form a test structure 500. The conductive layer 520 is electrically connected to the first landing pad 332 and the second landing pad 334 through the second barrier layer 510. In some embodiments, the second barrier layer 510 includes titanium (Ti), titanium nitride (TiN), tantalum mononitride (TaN), or combinations thereof, but the disclosure is not limited thereto. For example, the second barrier layer 510 includes several stacked barrier layers. In some embodiments, the conductive layer 520 includes tungsten (W), tungsten silicide (WSi$_2$), aluminum (Al), copper (Cu), titanium (Ti), titanium nitride (TIN), cobalt (Co), polysilicon, or combinations thereof, but the disclosure is not limited thereto. In some embodiments, the materials of the conductive layer 520 and the second barrier layer 510 are different. In some embodiments, the material of the second barrier layer 510 is different from the materials of the first landing pad 332 and the second landing pad 334. In some embodiments, the conductive layer 520 includes tungsten (W), and the second barrier layer 510 includes titanium nitride (TiN).

A first upper surface S1 of the first landing pad 332 and a second upper surface S2 of the second landing pad 334 are entirely covered by the second barrier layer 510 and also entirely covered by the conductive layer 520. In some embodiments, an upper surface of the conductive layer 520 is planarized by, for example, chemical-mechanical planarization (CMP). In some embodiments, the conductive layer 520 is a continuous layer and has a substantially planar upper surface US.

As shown in FIG. 5, in the test structure 500, the first gate structure G1, the second gate structure G2, the first source/drain region 110, the second source/drain region 120, the third source/drain region 130, the first isolation structure IS1, the second isolation structure IS2, and the third isolation structure IS3 are disposed in the semiconductor substrate 100. The first source/drain region 110 and the second source/drain region 120 are disposed at two sides of the first gate structure G1, and the first source/drain region 110 and the third source/drain region 130 are at two sides of the second gate structure G2. The bit line structure 210 and the first barrier layer 220 are disposed on the first source/drain region 110. The dielectric layer 230 is disposed on the semiconductor substrate 100 and the bit line structure 210. The first landing pad 332 and the second landing pad 334 are disposed on the dielectric layer 230. The first contact plug 310 is disposed in the dielectric layer 230 and electrically connects the second source/drain region 120 and the first landing pad 332. Similarly, the second contact plug 320 is disposed in the dielectric layer 230 and electrically connects the third source/drain region 130 and the second landing pad 334. The conductive layer 520 is disposed on and electrically connected to the first landing pad 332 and the second landing pad 334, in which the first upper surface S1 of the first landing pad 332 and the second upper surface S2 are entirely covered by the conductive layer 520.

Still referring to FIG. 5, the second barrier layer 510 is disposed between the conductive layer 520 and the first landing pad 332 and also between the conductive layer 520 and the second landing pad 334. In other words, the second barrier layer 510 is disposed on the first landing pad 332 and the second landing pad 334 and under the conductive layer 520. In some embodiments, the second barrier layer 510 conformally covers the dielectric layer 230, the first landing pad 332, and the second landing pad 334. In some embodiments, the second barrier layer 510 is in contact with the first landing pad 332, the second landing pad 334, and the conductive layer 520 to enhance the adhesion between the first landing pad 332, the second landing pad 334, and the conductive layer 520. More specifically, the second barrier layer 510 is in contact with the first upper surface S1 and a first sidewall SW1 of the first landing pad 332 and the second upper surface S2 and a second sidewall SW2 of the second landing pad 334.

Figure 6:
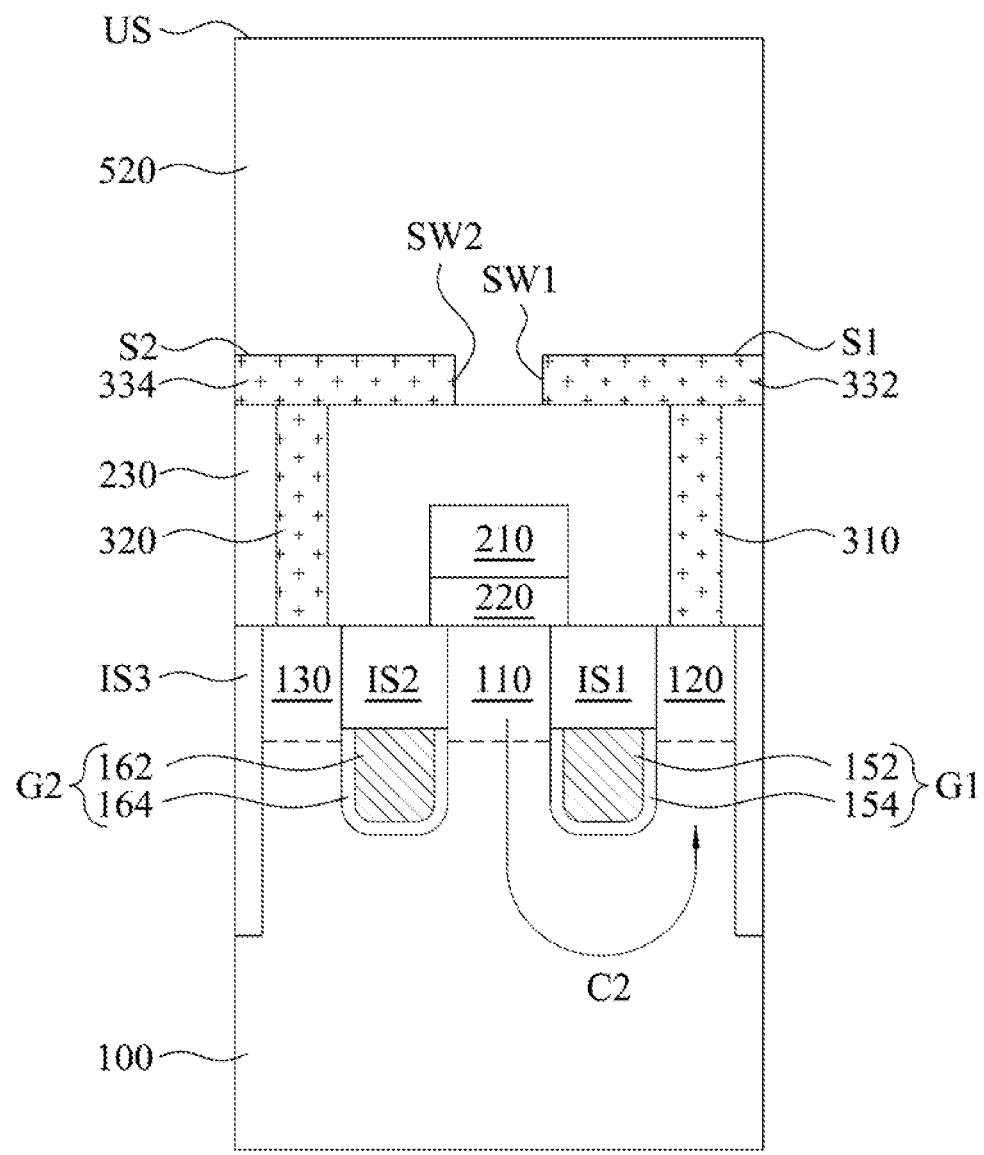

Reference is made to FIG. 6. A test structure 600 is provided. A manufacturing method of the test structure 600 can refer to the manufacturing method of the test structure 500. The difference between the manufacturing methods is that, in the manufacturing method of the test structure 500, the second barrier layer 510 is further formed on the first landing pad 332 and the second landing pad 334 and under the conductive layer 520. On the other hand, in the test structure 600, the conductive layer 520 is in contact with the first upper surface S1 of the first landing pad 332 and the second upper surface S2 of the second landing pad 334, and therefore the conductive layer 520 is directly electrically connected to the first landing pad 332 and the second landing pad 334. The conductive layer 520 has a substantially planar upper surface US. In some embodiments, the conductive layer 520 is in contact with the first sidewall SW1 of the first landing pad 332 and the second sidewall SW2 of the second landing pad 334. In some embodiments, the material of the conductive layer 520 is different from the materials of the first landing pad 332 and the second landing pad 334.

Figure 7:
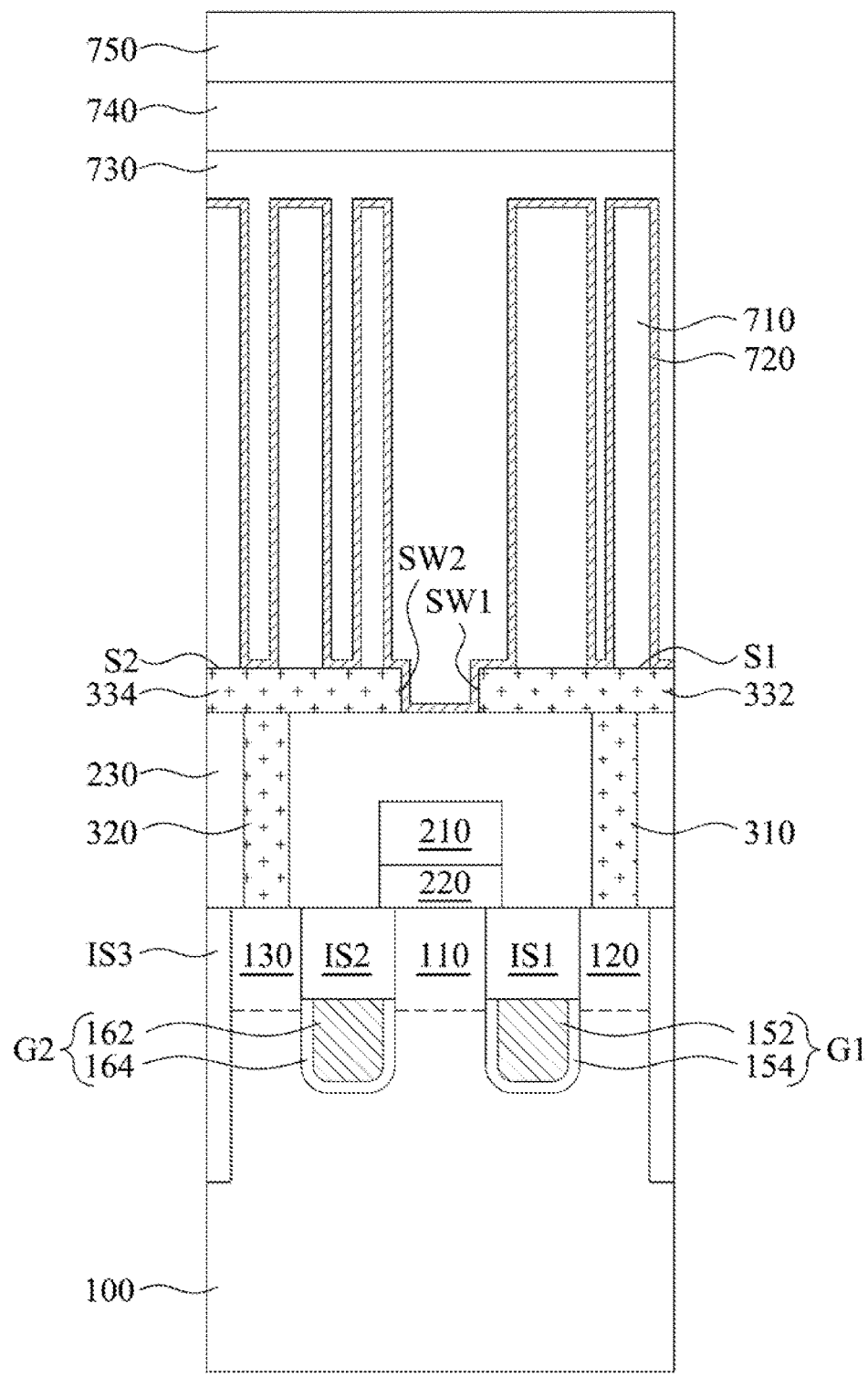
FIG. 7 is a cross-sectional view schematically illustrating a dynamic random access memory (DRAM) cell structure, in accordance with some embodiments of the present disclosure.

Please refer FIG. 7. FIG. 7 is a cross-sectional view schematically illustrating a dynamic random access memory (DRAM) cell structure, in accordance with some embodiments of the present disclosure.

As shown in FIG. 7, a DRAM cell structure 700 is provided. Conductive pillars 710 are disposed on the first landing pad 332 and the second landing pad 334, and a dielectric layer 720 conformally covers top surfaces and sidewalls of the conductive pillars 710. A first conductive layer 730, a second conductive layer 740, and a third conductive layer 750 are sequentially disposed on the dielectric layer 720. The first conductive layer 730, the second conductive layer 740, and the third conductive layer 750 act as a field plate of cell capacitors, and the conductive pillars 710 act as storage electrodes. In some embodiments, the first conductive layer 730, the second conductive layer 740, and the third conductive layer 750 independently include tungsten (W), tungsten silicide, aluminum (Al), copper (Cu), titanium (Ti), titanium nitride, cobalt (Co), silicon-germanium (SiGe), polysilicon, or combinations thereof. For example, the first conductive layer 730 includes SiGe, the second conductive layer 740 includes polysilicon, and the third conductive layer 750 includes W.

Please refer FIG. 7 and FIG. 5 simultaneously. The test structure 500 and the DRAM cell structure 700 can be manufactured in the same process. However, the test structure 500 does not include the conductive pillars 710 and the dielectric layer 720 shown in the DRAM cell structure 700. In other words, the test structure 500 does not include a capacitor structure. Therefore, in the test structure 500, the substantially planar upper surface US of the conductive layer 520 is not in contact with a dielectric material.

Figure 8:
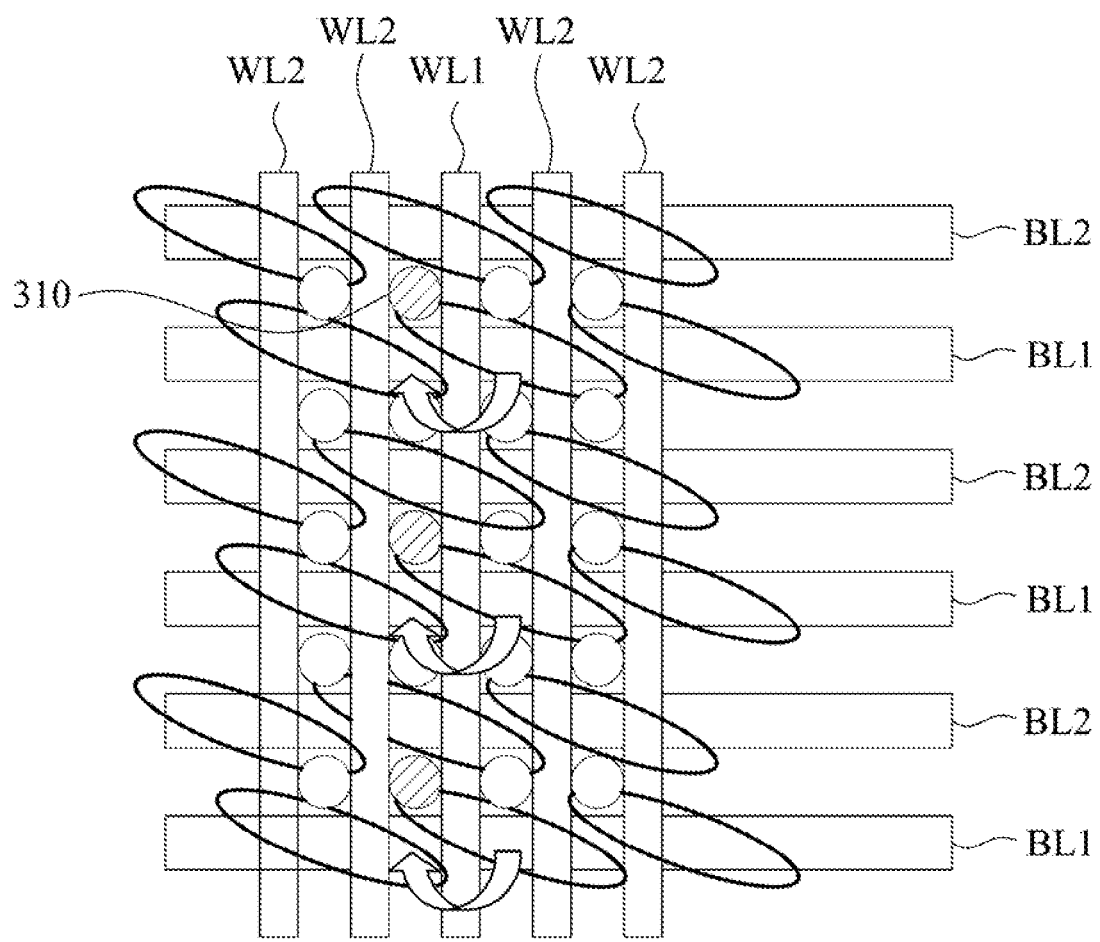
FIG. 8 is a schematic view operating a test structure array for use in a dynamic random access memory, in accordance with some embodiments of the present disclosure.

Next, please refer FIG. 8 and FIG. 5 simultaneously. FIG. 8 is a schematic view operating a test structure array for use in a dynamic random access memory, in accordance with some embodiments of the present disclosure.

The test structure 500 can detect the electrical performance of the first landing pad 332 and the second landing pad 334 from a wafer acceptance test (WAT). In the test structure 500, the first gate structure G1 and the second gate structure G2 serve as word lines. As shown in FIG. 8, a first word line WL1, second word lines WL2, first bit lines BL1, and second bit lines BL2 are provided. Multiple test structures 500 can be arranged as an array as shown in FIG. 8, and the oval circles in FIG. 8 represent the positions of active regions. When only the first word line WL1 and the first bit lines BL1 are turned on, a current C1 flows from the bit line structure 210 to the first landing pad 332 as shown in FIG. 5. The current C1 flows through the first source/drain region 110, the second source/drain region 120, and the first contact plug 310. FIG. 8 shows several first contact plugs 310, and the current C1 flows through each of the first contact plugs 310. The WAT is performed to monitor drain-to-source current and therefore can know the quality of the first landing pad 332. If the WAT test result shows normal and desired current data, it means that reliable electrical connection between the first gate structure G1 and the first landing pad 332 is obtained, and the first landing pad 332 has good quality and does not have structural problems, such as necking issue.

Please refer FIG. 7 and FIG. 6 simultaneously. The test structure 600 and the DRAM cell structure 700 can be manufactured in the same process. However, the test structure 600 does not include the conductive pillars 710 and the dielectric layer 720 shown in the DRAM cell structure 700. In other words, the test structure 600 does not include a capacitor structure.

Next, please refer FIG. 8 and FIG. 6 simultaneously. Similarly, the test structure 600 also can detect the electrical performance of the first landing pad 332 and the second landing pad 334 from the WAT. Multiple test structures 600 can be arranged as an array as shown in FIG. 8. When only the first word line WL1 and the first bit lines BL1 shown in FIG. 8 are turned on, a current C2 flows from the bit line structure 210 to the first landing pad 332 as shown in FIG. 6. The current C2 flows through the first source/drain region 110, the second source/drain region 120, and the first contact plug 310. FIG. 8 shows several first contact plugs 310, and the current C2 flows through each of the first contact plugs 310. The WAT is performed to monitor the drain-to-source current and therefore can know the quality of the first landing pad 332. If the WAT test result shows normal and desired current data, it means that reliable electrical connection between the first gate structure G1 and the first landing pad 332 is obtained, and the first landing pad 332 has good quality and does not have structural problems, such as necking issue.

The present disclosure provides a test structure for use in a dynamic random access memory and a manufacturing method thereof. The test structure can detect the quality and the electrical performance of the landing pad at the front end of the manufacturing process by the WAT. If normal and desired current data is obtained, the manufacturer can verify that the landing pad has good quality, and the electrical connection between the gate structure and the landing pad is well formed.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A test structure for use in a dynamic random access memory, comprising:
   a semiconductor substrate;
   a first gate structure disposed in the semiconductor substrate;
   a first source/drain region and a second source/drain region disposed in the semiconductor substrate and at two sides of the first gate structure;
   a bit line structure disposed on the first source/drain region;
   a dielectric layer disposed on the semiconductor substrate and the bit line structure;
   a first landing pad disposed on the dielectric layer;
   a first contact plug disposed in the dielectric layer and electrically connecting the second source/drain region and the first landing pad; and
   a conductive layer disposed on and electrically connected to the first landing pad, wherein a first upper surface of the first landing pad is entirely covered by the conductive layer, the conductive layer has a substantially planar upper surface, and the conductive layer covers a first sidewall of the first landing pad.

2. The test structure of claim 1, wherein the substantially planar upper surface of the conductive layer is not in contact with a dielectric material.

3. The test structure of claim 1, wherein the conductive layer is in contact with the first upper surface of the first landing pad.

4. The test structure of claim 1, wherein the conductive layer is in contact with the first sidewall of the first landing pad.

5. The test structure of claim 1, further comprising a barrier layer between the conductive layer and the first landing pad.

6. The test structure of claim 5, wherein the barrier layer conformally covers the dielectric layer and the first landing pad.

7. The test structure of claim 5, wherein the barrier layer is in contact with the conductive layer and the first landing pad.

8. The test structure of claim 1, further comprising:
a second gate structure disposed in the semiconductor substrate;
a third source/drain region disposed in the semiconductor substrate, wherein the first source/drain region and the third source/drain region are at two sides of the second gate structure;
a second landing pad disposed between the dielectric layer and the conductive layer; and
a second contact plug disposed in the dielectric layer and electrically connecting the third source/drain region and the second landing pad, wherein the conductive layer is electrically connected to the second landing pad, and a second upper surface of the second landing pad is entirely covered by the conductive layer.

9. The test structure of claim 8, wherein the conductive layer is a continuous layer.

10. The test structure of claim 8, wherein the conductive layer is in contact with the first upper surface of the first landing pad and the second upper surface of the second landing pad.

11. The test structure of claim 8, wherein the conductive layer is in contact with the first sidewall of the first landing pad and a second sidewall of the second landing pad.

12. The test structure of claim 8, further comprising a barrier layer on the first landing pad and the second landing pad and under the conductive layer.

13. The test structure of claim 12, wherein the barrier layer conformally covers the dielectric layer, the first landing pad, and the second landing pad.

14. The test structure of claim 12, wherein the barrier layer is in contact with the first landing pad, the second landing pad, and the conductive layer.

15. A method of manufacturing a test structure for use in a dynamic random access memory, the method comprising:
receiving a semiconductor substrate, a first gate structure, a first source/drain region, and a second source/drain region, wherein the first gate structure, the first source/drain region, and the second source/drain region are disposed in the semiconductor substrate, and the first source/drain region and the second source/drain region are at two sides of the first gate structure;
forming a bit line structure on the first source/drain region;
forming a dielectric layer on the bit line structure and the semiconductor substrate;
forming a first contact plug penetrating through the dielectric layer, wherein the first contact plug is in contact with the second source/drain region;
forming a first landing pad on the first contact plug; and
forming a conductive layer on the first landing pad, wherein the conductive layer is electrically connected to the first landing pad, a first upper surface of the first landing pad is entirely covered by the conductive layer, the conductive layer has a substantially planar upper surface, and the conductive layer covers a sidewall of the first landing pad.

16. The method of claim 15, further comprising planarizing an upper surface of the conductive layer.

17. The method of claim 15, further comprising forming a barrier layer on and in contact with the first landing pad before forming the conductive layer on the first landing pad.

18. The method of claim 15, wherein forming the conductive layer on the first landing pad comprises: forming the conductive layer in contact with the first landing pad.

19. The method of claim 15, further comprising:
receiving a second gate structure and a third source/drain region, wherein the second gate structure and the third source/drain region are disposed in the semiconductor substrate, and the first source/drain region and the third source/drain region are at two sides of the first gate structure;
forming a second contact plug penetrating through the dielectric layer and in contact with the third source/drain region;
forming a second landing pad on the second contact plug; and
forming the conductive layer on the second landing pad, wherein the conductive layer is electrically connected to the second landing pad, and a second upper surface of the second landing pad is entirely covered by the conductive layer.

20. The method of claim 19, wherein after forming the conductive layer on the first landing pad, the conductive layer is in contact with the first landing pad and the second landing pad.

* * * * *